United States Patent
Reeder et al.

(10) Patent No.: US 7,804,299 B2
(45) Date of Patent: Sep. 28, 2010

(54) DIFFUSION WEIGHTED PREPARATORY SEQUENCE FOR MAGNETIC RESONANCE IMAGING PULSE SEQUENCE

(75) Inventors: Scott B. Reeder, Middleton, WI (US); Reed Busse, Madison, WI (US); Jean H. Brittain, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 468 days.

(21) Appl. No.: 11/800,374

(22) Filed: May 4, 2007

(65) Prior Publication Data

US 2008/0275329 A1 Nov. 6, 2008

(51) Int. Cl.
*G01V 3/00* (2006.01)
(52) U.S. Cl. ...................................... 324/309
(58) Field of Classification Search ......... 324/300–322; 600/407–435
See application file for complete search history.

(56) References Cited

U.S. PATENT DOCUMENTS

| | | | | |
|---|---|---|---|---|
| 6,078,176 | A * | 6/2000 | McKinnon | 324/309 |
| 6,246,238 | B1 * | 6/2001 | Hennig | 324/307 |
| 6,794,866 | B2 * | 9/2004 | Ferrage et al. | 324/307 |
| 6,842,000 | B2 * | 1/2005 | Norris et al. | 324/309 |
| 7,474,097 | B2 * | 1/2009 | Bydder et al. | 324/307 |
| 7,511,494 | B2 * | 3/2009 | Wedeen | 324/309 |
| 7,633,291 | B2 * | 12/2009 | Zwanger | 324/309 |
| 2004/0071324 | A1 | 4/2004 | Norris et al. | |
| 2007/0249929 | A1 * | 10/2007 | Jeong et al. | 600/410 |
| 2008/0319301 | A1 * | 12/2008 | Busse | 600/410 |

OTHER PUBLICATIONS

J. Coremans et al, A Comparison Between Different Imaging Strategies for Diffusion Measurements with the Centric Phase-Encoded TurboFLASH Sequence, Journal Of Magnetic Resonance 124, 323-342 (1997).
F. Klammler et al, Volume-selective and spectroscopically resolved NMR investigation of diffusion and relaxation in fertilised hen eggs, Phys. Med. Biol., 1990 vol. 35, No. 1, 67-79.
M. Deimling et al, Diffusion Weighted Imaging With Turbo-FLASH, Book of Abstracts, vol. 1, Society of Magnetic Resonance in Medicine, Ninth Annual Scientific Meeting and Exhibition, Aug. 18-24, 1990, NY, NY.
David A. Feinberg et al, Perfusion Imaging by 3D FT Echo Planar Utilizing Separate Pulse Sequences for Low Velocity and Diffusion Encoding; Book of Abstracts, vol. 1, Society of Magnetic Resonance in Medicine, Eighth Annual Scientific Meeting and Exhibition, Aug. 12-18, 1989, Amsterdam, The Netherlands.
William H. Perman et al, DPSF: Snapshot Flash Diffusion/Perfusion Imaging, Book of Abstracts, vol. 1, Society of Magnetic Resonance in Medicine, Ninth Annual Scientific Meeting and Exhibition, Aug. 18-24, 1990, NY, NY.

(Continued)

*Primary Examiner*—Brij B Shrivastav
(74) *Attorney, Agent, or Firm*—Quarles & Brady LLP

(57) ABSTRACT

A preparatory pulse sequence is applied prior to an imaging pulse sequence during a diffusion-weighted MRI scan. The preparatory pulse sequence diffusion weights the longitudinal magnetization using a gradient waveform that is first moment nulled to reduce image artifacts caused by patient motion.

3 Claims, 5 Drawing Sheets

OTHER PUBLICATIONS

PCT/US2008057228 International Search Report and Written Opinion; 13 pages.

D G Norris: Implications of Bulk Motion for Diffusion-Weighted Imaging Experiments: Effects, Mechanisms and Solutions, Journ. of Mag. Resonance Imaging, vol. 13, 2001, pp. 486-495.

Yongbi M N et al: A Modified Sub-Second Fast-Steam Sequence Incorporation Bipolar Ghradients for In vivo Diffusion Imaging; Magnetic Resonance in Medicine, Academic Press, Duluth MN, vol. 35, No. 6, Jun. 1, 1996, pp. 911-916.

T G Reese et al: Reduction of Eddy-Current-Induced Distortion in Diffusion MRI Using A Twice-Refocused Spin Echo, Magnetic Resonance in Medicine, vol. 49, 2003, pp. 117-182.

R Nana et al: Ex Vivo Diffusion Anisotrophy Measurement for the Evaluation of Gastric Tissue Fiber Directions Using 3D Turbo STEAM Sequence; Proc. Intl. Soc. Mag. Reson. Med. 14, 2006, p. 2227.

Feinberg D A et al: Tissue Perfusion In Humans Studied By Fourier Belocity Distribution, Line Scan and Echo-Planar Imaging; Magnetic Resonance In Medicine, Academic Press, Duluth MN, vol. 16, No. 2; Nov. 1, 1990.

* cited by examiner

DIFFUSION WEIGHTED PREPARATORY SEQUENCE FOR MAGNETIC RESONANCE IMAGING PULSE SEQUENCE

BACKGROUND OF THE INVENTION

The field of the invention is nuclear magnetic resonance imaging (MRI) methods and systems. More particularly, the invention relates to MRI diffusion weighted imaging (DWI).

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the gyromagnetic constant gamma (of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net longitudinal magnetization $M_0$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net longitudinal magnetization, $M_0$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the "MR" image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. MR imaging is employed to image a number of anatomical and physiological features of living animals.

Diffusion-weighted imaging (DWI) is a powerful MRI technique for probing microscopic tissue structure. In DWI, a pulse sequence is employed which contains a magnetic field gradient known as a diffusion gradient that sensitizes the MR signal to spin motion. A DWI pulse sequence is shown in FIG. 2. It includes the generation of a 90° selective RF excitation pulse 100 which is produced in the presence of a slice select gradient pulse 102 to excite spins in a 2D slice. A 180° RF refocusing pulse 104 is produced in the presence of a slice select gradient pulse 106 to refocus the transverse magnetization and an NMR signal 108 is acquired at that time in the presence of a readout gradient pulse 110. The pulse sequence is repeated and a phase encoding gradient pulse 112 produced just prior to signal readout is stepped through different values to sample k-space in the conventional manner.

Diffusion weighting of the acquired NMR signal 108 is provided by diffusion gradients 114, 116 and 118 applied along the respective slice select, phase encode and readout gradient axes. Each diffusion weighted gradient 114, 116 and 118 includes a first gradient lobe produced prior to the 180° RF pulse 104, and a second gradient lobe produced after the 180° RF pulse 104. The first and second diffusion gradient lobes are of equal size (area), but their relative values are changed to measure diffusion in different directions. In this spin echo sequence the two lobes of the diffusion gradient waveform are produced before and after the 180° RF pulse 104 and they have the same polarity. If the diffusion gradient is employed in a pulse sequence that does to have a 180° RF pulse, its waveform takes the form shown in FIG. 4. In this alternative embodiment the waveform is the same as that described above except the two lobes have opposite polarity.

In a DWI pulse sequence the detected MR signal intensity decreases with the speed of water diffusion in a given volume of tissue. The first moment of the diffusion gradient, also known as the "b-value" determines the speed of diffusion to which the image is sensitive. This b-value may be adjusted by either varying the area of the two lobes of the diffusion magnetic field gradient, or by varying the time interval between them. Referring to FIGS. 3 and 4, when water motion in the subject is unrestricted, the MR signal intensity at the center of the echo using a spin-echo diffusion-weighted pulse sequence is related to the b-value as follows:

$$A = \frac{S(b)}{S_0} = e^{-bD} \quad (1)$$

where the "b-value" $b=\gamma^2 G^2 \delta^2 (\Delta - \delta/3)$. The parameter $\gamma$ is the gyromagnetic ratio and G is the amplitude of the applied diffusion magnetic field gradients. S(b) is the MR signal magnitude with diffusion weighting b, and $S_0$ is the MR signal magnitude with no diffusion weighting (b=0). The parameter D is the diffusion coefficient of water within itself (in $mm^2/s$), which directly reflects the fluid viscosity where there are no structural restrictions to diffusion of the water. As shown in FIGS. 3 and 4, $\Delta$ is the time interval between the onsets of the two diffusion gradient lobes and $\delta$ is the duration of each gradient lobe. The diffusion coefficient D in equation (1) may be calculated, since b is known and the attenuation A can be measured.

There are a large number of clinically scientifically important applications for DWI. These include early detection and characterization of cytotoxic edema caused by cerebral infarction, improved tumor characterization through detection of restricted diffusion within a cellular tumor, and cerebral "tractography" for fiber angle mapping of the cerebral white matter, as well as many others. Within the abdomen, low b-value DWI is commonly used for liver imaging, to null the signal from flowing blood to improve the conspicuity of liver lesions such as metastases or primary liver tumors.

Unfortunately, DWI is exquisitely sensitive to motion. Large phase shifts from small patient bulk translations are encoded by the large amplitude diffusion weighted gradients. These phase shifts are extremely problematic for most DWI imaging methods such as that described above and illustrated in FIG. 2, which are "multi-shot" methods, i.e., require multiple excitations and acquisitions in order to form a complete k-space matrix prior to Fourier transformation. The slightest amount of motion leads to large phase misregistrations between data acquired in the different shots due to first and higher order moment phase shifts from velocity and acceleration during the time that the diffusion pulses are being played. Such phase shifts lead to devastating image artifacts in the form of severe ghosting and blurring. For this reason, most DWI methods rely on echo planar imaging (EPI) which is a high SNR, ultra-rapid method that can acquire all lines of k-space in a single shot, avoiding problems of phase misregistration. However, EPI suffers from poor spatial resolution, severe distortion in areas of high magnetic susceptibility, ghosting artifacts, and requires high performance hardware. Overall, the poor image quality of EPI has greatly restricted the clinical use of DWI.

SUMMARY OF THE INVENTION

The present invention is a method and MR pulse sequence that provides diffusion weighting to NMR signals acquired with an MR imaging pulse sequence without sensitizing for bulk patient motion. More specifically, a preparatory pulse sequence is performed prior to the imaging pulse sequence which diffusion weights the longitudinal spin magnetization $M_z$ using a gradient waveform that is first moment nulled such that phase shifts are produced in response to higher order patient motions, but not in response to the velocity of patient motion.

A general object of the invention is to provide a diffusion weighted preparatory pulse sequence that may be used prior to many different imaging pulse sequences and which is not sensitive to patient bulk motion during the scan. The diffusion weighted gradient waveform is shaped to gradient moment null phase shifts caused by the velocity of bulk patient movement, but is sensitive to acceleration and other higher order motions that are characteristic of diffusing spins.

DESCRIPTION OF THE PREFERRED EMBODIMENT

Figure 1:
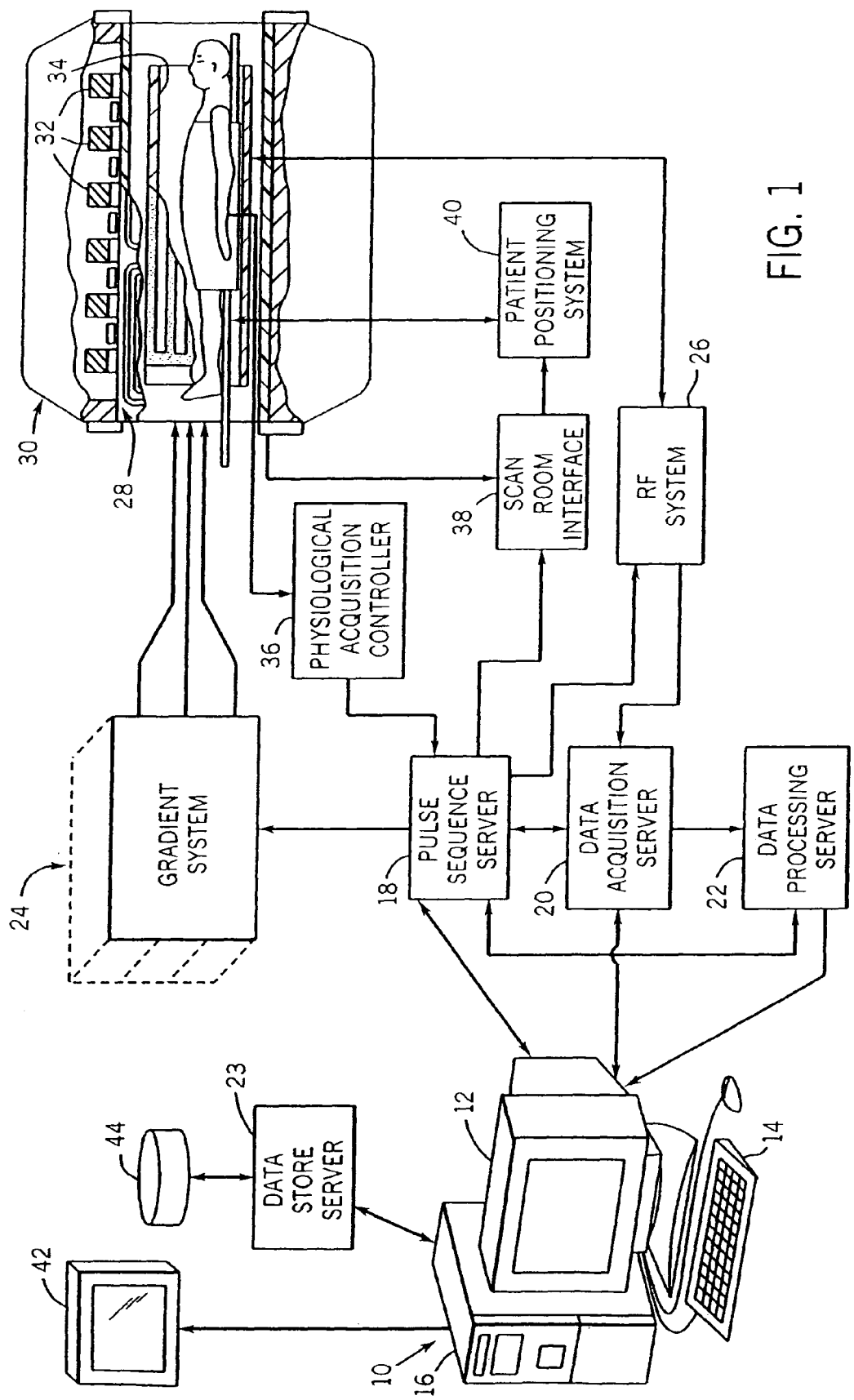
FIG. 1 is a block diagram of an MRI system which employs the present invention.
Figure 2:
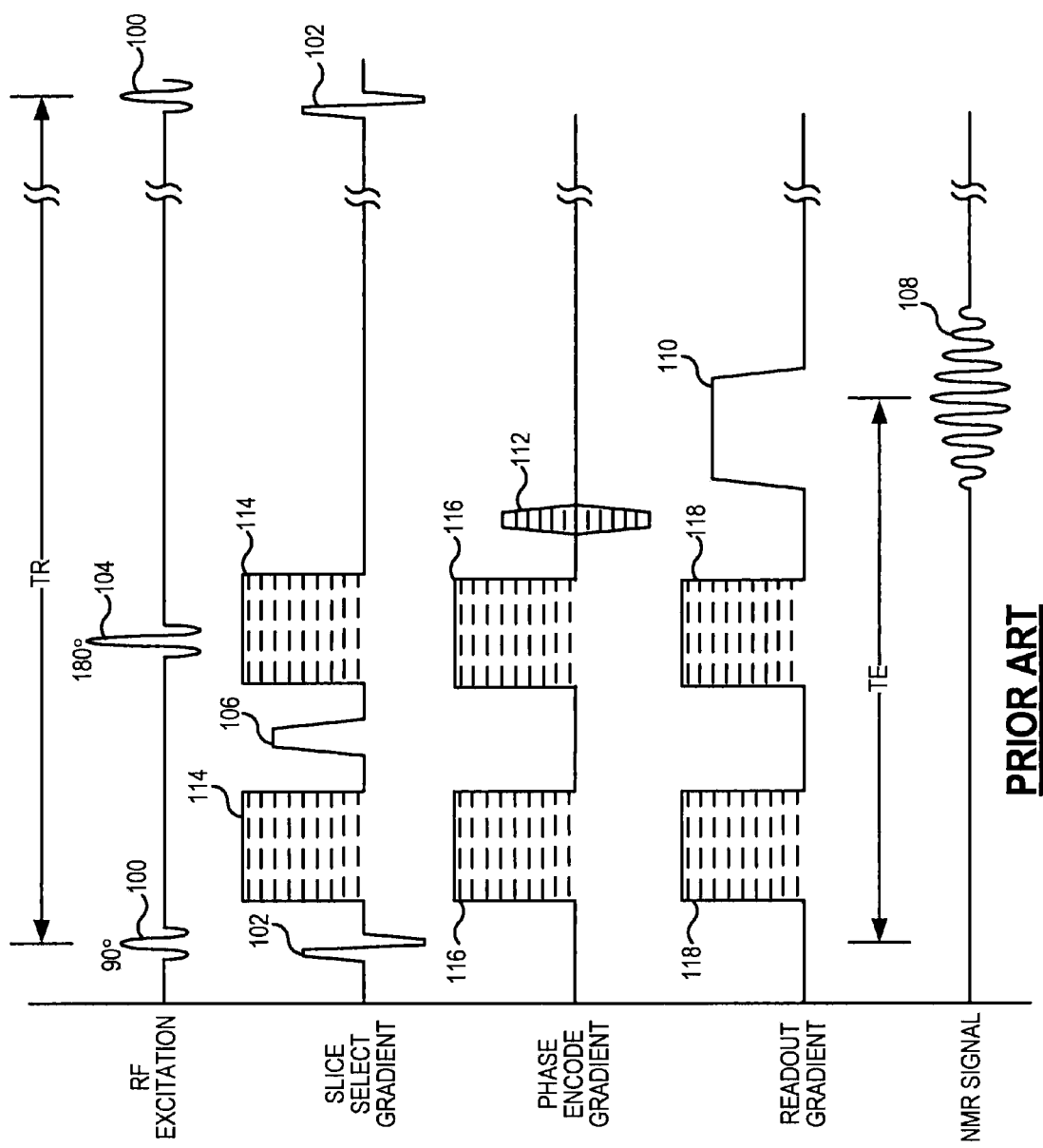
FIG. 2 is a graphic representation of a typical prior art DWI pulse sequence.
Figure 3:
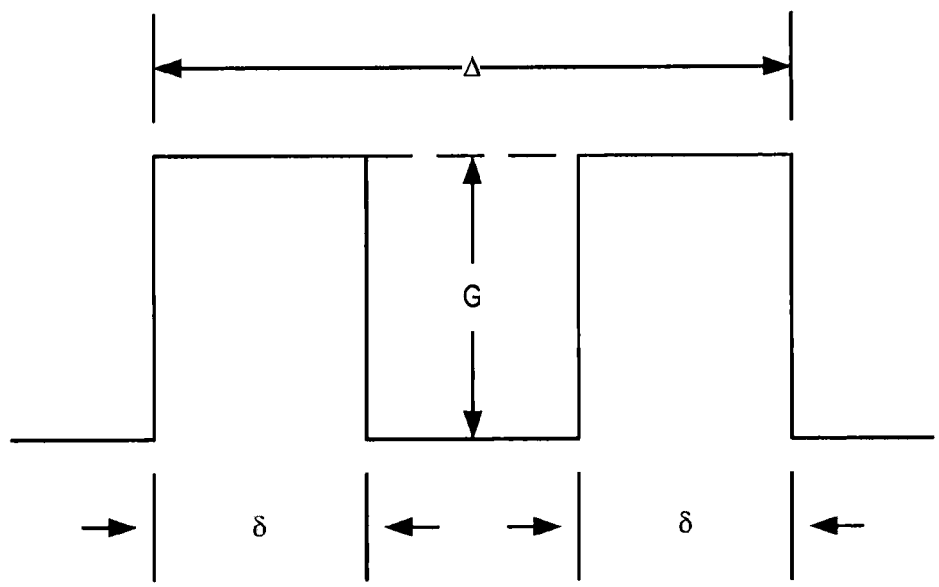
FIG. 3 is a graphic representation of a diffusion weighted gradient waveform used in the pulse sequence of FIG. 2.
Figure 4:
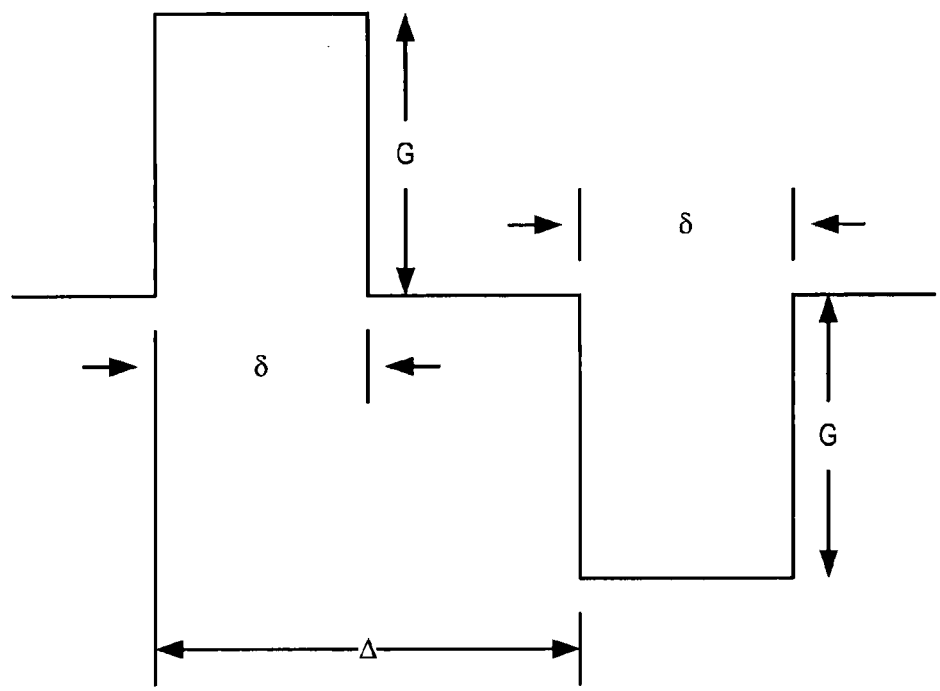
FIG. 4 is a graphic representation of an alternative diffusion weighted gradient waveform that can be used in the pulse sequence of FIG. 2.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M = \sqrt{I^2 + Q^2},$$

and the phase of the received NMR signal may also be determined:

$$\phi = \tan^{-1} Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images and the reconstruction of DWI images according to the present invention.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

The present invention is a method for operating the MRI system such that DWI images of the subject being scanned are produced. This method is embodied in a pulse sequence that is downloaded to the pulse sequence server 18. The pulse sequence server 18 executes the downloaded pulse sequence and in response the MRI system carries out the steps in the method.

Figure 5:
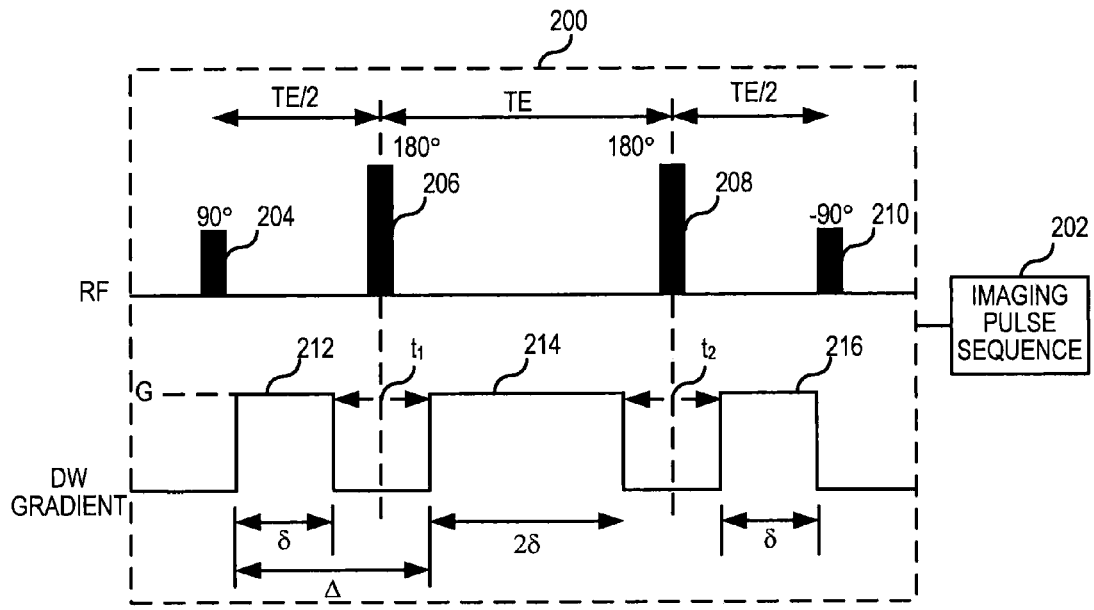
FIG. 5 is a graphic representation of a preferred embodiment of a preparation pulse sequence according to the present invention.

Referring particularly to FIG. 5, a DWI preparatory pulse sequence indicated generally by dashed lines 200 is performed prior to an imaging pulse sequence 202. The imaging pulse sequence 202 may be of any type, including multi-shot methods such as FSE, SPGR and SSFP.

As will be explained in more detail below, unlike conventional DWI which encodes DW information into transverse magnetization, the preparatory pulse sequence 200 encodes the diffusion weighted information into the longitudinal magnetization $M_z$ of the spins that are the subject of the scan. Any imaging pulse sequence 202 may then be used to acquire the NMR signals that are produced by this diffusion weighted spin magnetization.

Referring still to FIG. 5, in this preferred embodiment a $90_x°$ rf excitation pulse 204 is applied to tip the longitudinal magnetization $M_z$ into the transverse plane to produce transverse magnetization $M_{xy}$. This is followed by two $180_y°$ refocusing pulses 206 and 208, and then finally a third $-90_x°$ rf "tip-up" pulse 210. The absolute phase of these rf pulses is not important, it is their relative phase that matters. A $[270_x°]$ $[-360_x°]$ pulse pair is an alternative commonly used by other tip-up methods in order to compensate for $B_1$ and $B_0$ inhomogeneities. After the tip-up pulse 210, large spoiler gradients are used to crush residual transverse magnetization (not shown in the figures). As with other preparation pulses, the RF pulses are non-selective (hard pulses), although one could easily use spatially selective pulses as well, which would require the use of slice selection gradients (not shown).

In the preferred embodiments two rf refocusing pulses 206 and 208 are employed to ensure that the diffusion weighted transverse magnetization is efficiently tipped back up to the longitudinal axis by the rf excitation pulse 210. More specifically, the times between the respective rf pulses 204, 206, 208 and 210 are set such that the diffusion weighted transverse magnetization refocuses at the moment the tip-up rf excitation pulse 210 is produced. Two identical refocusing pulses are employed so that any imperfections in one refocusing pulse is offset by the second refocusing pulse.

The preferred preparatory pulse sequence 200 also includes a DWI gradient waveform comprised of a first lobe 212 played out between the rf pulses 204 and 206, a second gradient lobe 214 played out between the RF pulses 206 and 208, and a third gradient lobe 216 played out between rf pulses 208 and 210. These gradient lobes 212, 214 and 216 are the sum of the applied component gradients $G_x$, $G_y$ and $G_z$ produced by the MRI system, and by changing these component values the DW gradient may be oriented in any direction. The gradient lobes 212 and 216 are equal in size (i.e., area) and their sum is equal to the size of the gradient lobe 214. The total diffusion weighting b of this DWI gradient waveform is:

$$b=2(\gamma\delta G)^2(\Delta-\delta/3).$$

The $0^{th}$ and $1^{st}$ gradient moments are nulled by making the time intervals $t_1$ and $t_2$ between rf pulses equal. As a result, phase shifts occur in the transverse magnetization produced by the tip-down rf pulse 204 as a result of higher order movements of spins, but no phase shifts occur due to bulk movement velocity of the patient in the direction of the DW gradient. When the spin magnetization is tipped back by the rf pulse 210, the resulting longitudinal magnetization is diminished in amplitude at voxel locations where diffusion is taking place, but is not diminished due to patient bulk motion. In other words, the longitudinal magnetization examined by the following imaging pulse sequence 202 is diffusion weighted, but is not sensitive to bulk patient motion. More importantly, there are no significant phase misregistrations in the image data acquired in different shots of the imaging pulse sequence 202 due to patient motion.

The imaging pulse sequence 202 is performed immediately following the preparatory sequence 200, and depending on the particular imaging pulse sequence used, one or more views of k-space data is acquired. It is diffusion-weighted k-space data as a result of the preparatory pulse sequence 200. The preparatory pulse sequence 200 and imaging pulse sequence 202 are repeated as many times as needed to acquire a complete k-space data set from which an image is reconstructed. Any standard image reconstruction normally used with the chosen image pulse sequence may be used.

Figure 6:
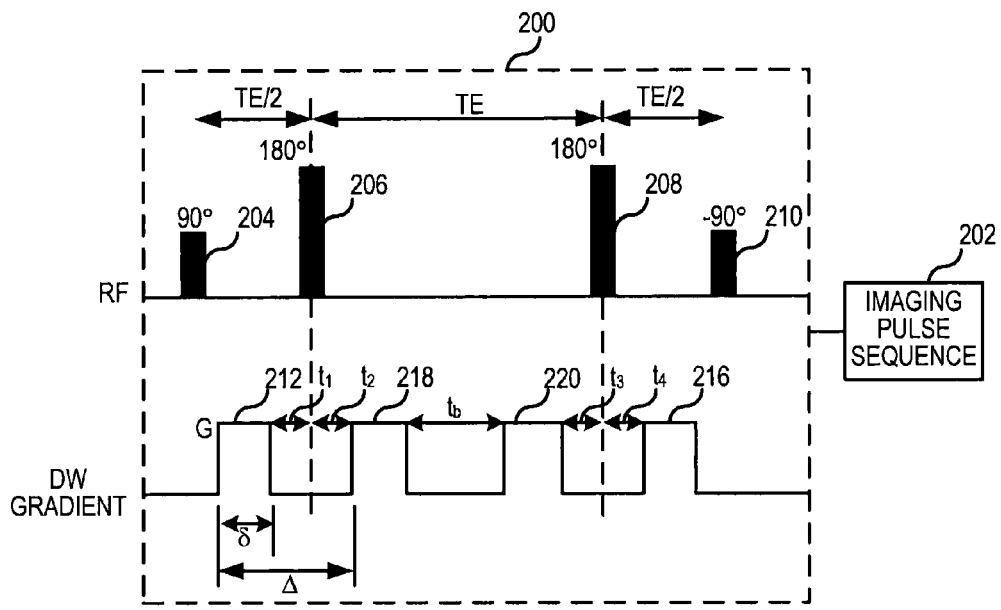
FIGS. 6 and 7 are graphic representations of alternative embodiments of preparation pulse sequences according to the present invention.
Figure 7:
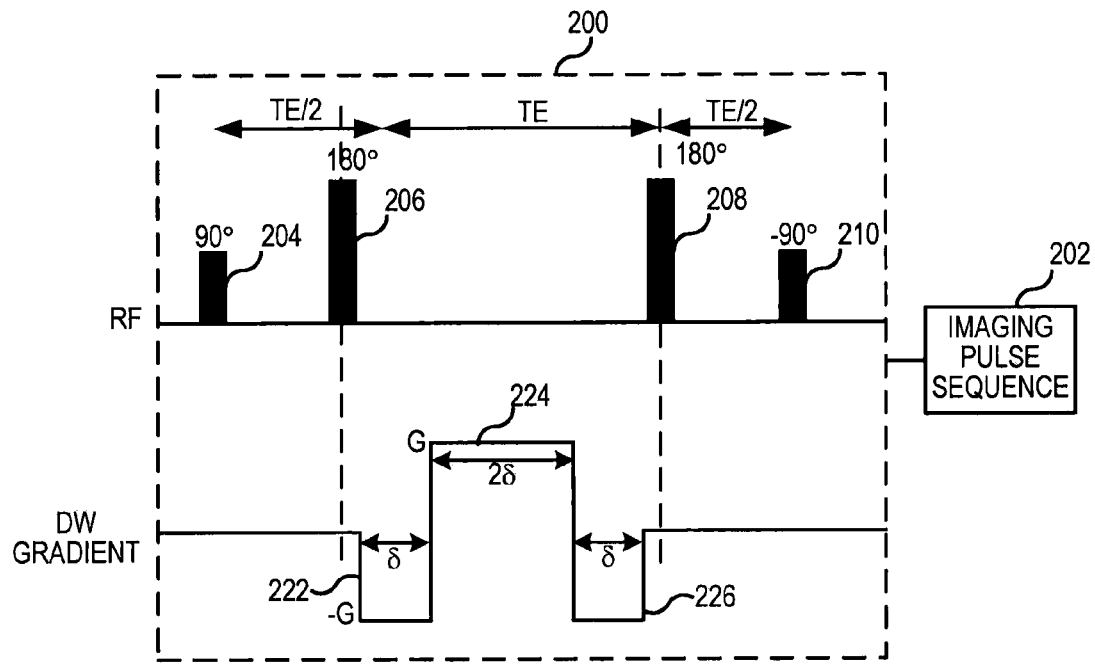

Alternative embodiments of the DW preparation pulse sequence are depicted in FIGS. 6 and 7. In the embodiment shown in FIG. 6, the only difference is in the separation of the middle gradient lobe into two equal sized gradient lobes 218 and 220 separated by the time $t_b$. This embodiment is used when larger values of diffusion weighting b are required. This is achieved by increasing the time $t_b$.

The embodiment of the invention depicted in FIG. 7 employs the same sequence of rf pulses 204, 206, 208 and 210, but the DW gradient waveform is different. The DW gradient waveform is played out between the two rf refocusing pulses 206 and 208 and it includes three lobes 222, 224 and 226. The lobes 222 and 226 have the same polarity and size while the middle lobe 224 has the opposite polarity and is equal in size to the sum of the lobes 222 and 226. This embodiment is more applicable to situations in which low diffusion weighting values b are used and the duration of the preparatory pulse sequence 200 is to be kept to a minimum.

In the above-described embodiments the diffusion-weighted gradient waveform is zero moment and first moment nulled and is sensitive to acceleration and higher order motion in the subject being examined. Sensitivity to acceleration and high order movements of spins provides the necessary diffusion weighting. In some clinical applications it may be necessary to desensitize the diffusion weighted gradient waveform to subject acceleration by adding second moment nulling. Such a diffusion gradient waveform is shown in FIG. 8.

Figure 8:
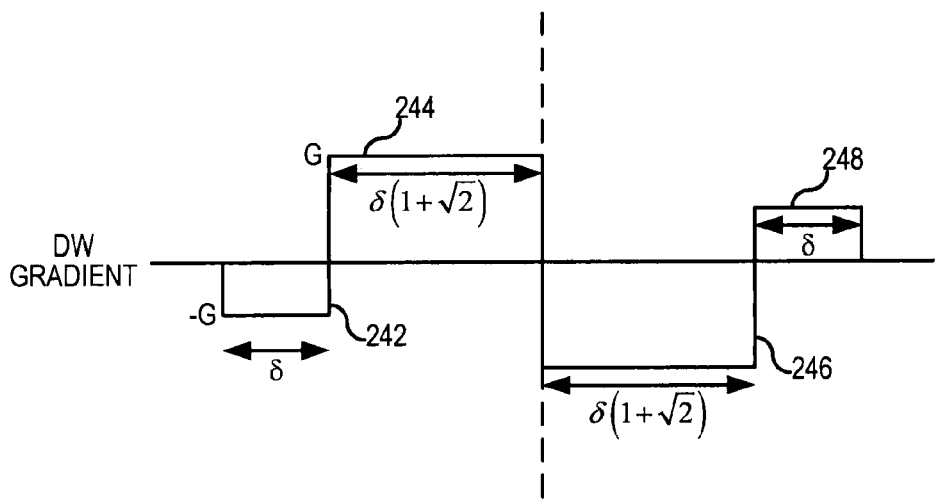
FIG. 8 is a graphic representation of an alternative diffusion weighted gradient waveform which is nulled for both velocity and acceleration.

Referring particularly to FIG. 8, the second moment nulled gradient waveform is anti-symmetrical about an axis 240 and includes a bipolar waveform comprised of lobes 242 and 244 to one side of axis 240 and a bipolar waveform comprised of lobes 246 and 248 to the other side. The gradient lobes 242 and 248 are equal in size (Gδ) and opposite in polarity, as are the gradient lobes 244 and 246 which are larger (Gδ(1+√2)). As with the gradient waveforms described above, this second moment nulled diffusion gradient waveform can be separated to increase the diffusion weighting, and 180° rf refocusing pulses can be applied during its playout to enable inversion of the polarity of gradient lobes.

The invention claimed is:

1. A method for producing a diffusion-weighted image with a magnetic resonance imaging (MRI) system, the steps comprising:
   a) performing a preparation pulse sequence with the MRI system that diffusion weights longitudinal magnetization in a subject, the preparation pulse sequence including:
   a)i) applying a radio frequency (RF) excitation pulse to produce transverse spin magnetization;
   a)ii) applying a first moment nulled diffusion weighting gradient waveform to diffusion weight the transverse spin magnetization;
   a)iii) applying an RF excitation pulse to produce diffusion-weighted longitudinal spin magnetization from the diffusion weighted transverse magnetization; and
   a)iv) applying an RF refocusing pulse such that the diffusion weighted transverse magnetization is refocused when the RF excitation pulse is produced in step a)iii);
   b) performing an imaging pulse sequence following step a);
   c) repeating steps a) and b) as necessary to acquire a set of data from which an image can be reconstructed; and
   d) reconstructing a diffusion-weighted image from the acquired set of data.

2. The method as recited in claim 1 in which the diffusion-weighted gradient waveform is also second moment nulled.

3. The method as recited in claim 1 in which a pair of RF refocusing pulses are applied during step a)iv).

* * * * *